(12) United States Patent
Kang et al.

(10) Patent No.: US 10,236,185 B2
(45) Date of Patent: Mar. 19, 2019

(54) METHOD OF FORMING PATTERNS FOR SEMICONDUCTOR DEVICE

(71) Applicant: Samsung Electronics Co., Ltd., Suwon-si, Gyeonggi-do (KR)

(72) Inventors: Yool Kang, Yongin-si (KR); Kyoung-sil Park, Seongnam-si (KR); Yun-seok Choi, Hwaseong-si (KR); Boo-deuk Kim, Suwon-si (KR); Ye-hwan Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/686,578

(22) Filed: Aug. 25, 2017

(65) Prior Publication Data

US 2018/0151362 A1 May 31, 2018

(30) Foreign Application Priority Data

Nov. 25, 2016 (KR) .................... 10-2016-0158048

(51) Int. Cl.
*H01L 21/308* (2006.01)
*H01L 21/033* (2006.01)
(Continued)

(52) U.S. Cl.
CPC ...... *H01L 21/3081* (2013.01); *H01L 21/0271* (2013.01); *H01L 21/02118* (2013.01);
(Continued)

(58) Field of Classification Search
CPC .......... H01L 21/3081; H01L 21/02118; H01L 21/02282; H01L 21/3086; H01L 21/0271;
(Continued)

(56) References Cited

U.S. PATENT DOCUMENTS 7,446,049 B2 11/2008 Kim et al.
7,981,594 B2 7/2011 Yoon et al.
(Continued)

FOREIGN PATENT DOCUMENTS

JP 2007188925 A 7/2007
KR 100704470 B1 4/2007
(Continued)

OTHER PUBLICATIONS

Machine Translation of KR 2012-0073819.*

*Primary Examiner* — Selim Ahmed
*Assistant Examiner* — Evan Clinton
(74) *Attorney, Agent, or Firm* — Harness, Dickey & Pierce, P.L.C.

(57) ABSTRACT

A method of forming patterns for a semiconductor device includes preparing a hardmask composition including a carbon allotrope, a spin-on hardmask (SOH) material, an aromatic ring-containing polymer, and a solvent, applying the hardmask composition to an etching target layer, forming a hardmask by heat-treating the applied hardmask composition, forming a photoresist pattern on the hardmask, forming a hardmask pattern by etching the hardmask using the photoresist pattern as an etching mask, and forming an etched pattern by etching the etching target layer using the hardmask pattern as an etching mask.

20 Claims, 14 Drawing Sheets

(51) Int. Cl.
*H01L 21/762* (2006.01)
*H01L 21/027* (2006.01)
*H01L 21/02* (2006.01)
*H01L 21/311* (2006.01)
*H01L 21/3213* (2006.01)
*H01L 27/108* (2006.01)
*B05D 1/00* (2006.01)
*B05D 3/02* (2006.01)

(52) U.S. Cl.
CPC .... *H01L 21/02282* (2013.01); *H01L 21/0332* (2013.01); *H01L 21/0337* (2013.01); *H01L 21/3086* (2013.01); *H01L 21/31144* (2013.01); *H01L 21/32139* (2013.01); *H01L 21/76224* (2013.01); *H01L 27/10885* (2013.01); *H01L 27/10891* (2013.01); *B05D 1/005* (2013.01); *B05D 3/0254* (2013.01); *B05D 3/0272* (2013.01); *H01L 27/10888* (2013.01)

(58) Field of Classification Search
CPC ........... H01L 21/0337; H01L 21/31144; H01L 21/32139; H01L 21/0332; B05D 3/0272; B05D 3/0254; B05D 1/005
See application file for complete search history.

(56) References Cited

U.S. PATENT DOCUMENTS

| | | |
|---|---|---|
| 2008/0194073 A1 | 8/2008 | Park |
| 2015/0010703 A1* | 1/2015 | Frommhold .............. C09C 1/44 427/240 |
| 2015/0348794 A1* | 12/2015 | Kim ...................... H01L 21/324 438/703 |
| 2016/0011511 A1 | 1/2016 | Shin et al. |
| 2016/0027645 A1 | 1/2016 | Shin et al. |
| 2016/0035617 A1* | 2/2016 | Kim ................... G03F 7/70683 438/586 |
| 2016/0225636 A1* | 8/2016 | Kim ................... H01L 21/3086 |
| 2017/0186602 A1 | 6/2017 | Yang et al. |

FOREIGN PATENT DOCUMENTS

| | | | |
|---|---|---|---|
| KR | 100811266 B1 | | 3/2008 |
| KR | 100908601 B1 | | 7/2009 |
| KR | 20120073819 A | * | 7/2012 |
| KR | 20120073819 A | | 7/2012 |
| KR | 20160100172 A | | 8/2016 |
| KR | 2017-0076112 A | | 7/2017 |

* cited by examiner

METHOD OF FORMING PATTERNS FOR SEMICONDUCTOR DEVICE

CROSS-REFERENCE TO RELATED APPLICATION

This application claims the benefit of Korean Patent Application No. 10-2016-0158048, filed on Nov. 25, 2016, in the Korean Intellectual Property Office, the disclosure of which is incorporated herein in its entirety by reference.

BACKGROUND

1. Field

Some example embodiments of the inventive concepts relate to a method of forming patterns for a semiconductor device, and more particularly, to a method of forming patterns for a semiconductor device using a hardmask composition including a carbon allotrope and a spin-on hardmask (SOH) material.

2. Description of the Related Art

Various photolithography technologies and patterning technologies have been proposed for performing fine patterning in a process of manufacturing a semiconductor device including a highly integrated integration circuit. As semiconductor devices have become highly integrated and the complexity of design rules has increased, general photolithography technologies are not sufficient to form fine patterns having an intended profile. Accordingly, a method of forming fine patterns by forming a hardmask between an etching target layer and a photoresist pattern may be used.

SUMMARY

Some example embodiments of the inventive concepts provide a method of forming patterns for a semiconductor device, in which fine patterns may be formed using a hardmask composition having desirable etching resistance.

However, the technical goal to be achieved by the inventive concepts is not limited thereto, and other technical goals that have not been mentioned will be clearly understood from the description below by those of ordinary skill in the art.

According to an example embodiment of the inventive concepts, a method of forming patterns for a semiconductor device include preparing a hardmask composition including a carbon allotrope, a spin-on hardmask (SOH) material, an aromatic ring-containing polymer, and a solvent, applying the hardmask composition to an etching target layer, forming a hardmask by heat-treating the applied hardmask composition, forming a photoresist pattern on the hardmask, forming a hardmask pattern by etching the hardmask using the photoresist pattern as an etching mask, and forming an etched pattern by etching the etching target layer using the hardmask pattern as an etching mask.

According to another example embodiment of the inventive concepts, a method of forming patterns for a semiconductor device include forming an etching target layer including an uneven pattern on a substrate, applying a hardmask composition including a carbon allotrope, a spin-on hardmask (SOH) material, an aromatic ring-containing polymer, and a solvent on the etching target layer, forming a hardmask by heat-treating the applied hardmask composition, sequentially forming an anti-reflection coating layer and a photoresist pattern on the hardmask, and forming a hardmask pattern by etching the anti-reflection coating layer and the hardmask using the photoresist pattern as an etching mask.

According to another example embodiment of the inventive concepts, a method of manufacturing an integrated circuit device includes forming a device isolation layer in a substrate to define a plurality of active regions, forming an etching target layer on the substrate, preparing a hardmask composition including a carbon allotrope, a spin-on hardmask (SOH) material, an aromatic ring-containing polymer, and a solvent, applying the hardmask composition to the etching target layer, forming a hardmask by heat-treating the applied hardmask composition, forming a photoresist pattern on the hardmask, forming a hardmask pattern by etching the hardmask using the photoresist pattern as an etching mask, and forming an etched pattern by etching the etching target layer using the hardmask pattern as an etching mask.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Hereinafter, example embodiments of the inventive concepts will be described in detail with reference to the accompanying drawings. The singular forms "a," "an," and "the" used herein are intended to include the plural forms as well, unless the context clearly indicates otherwise.

Figure 1:
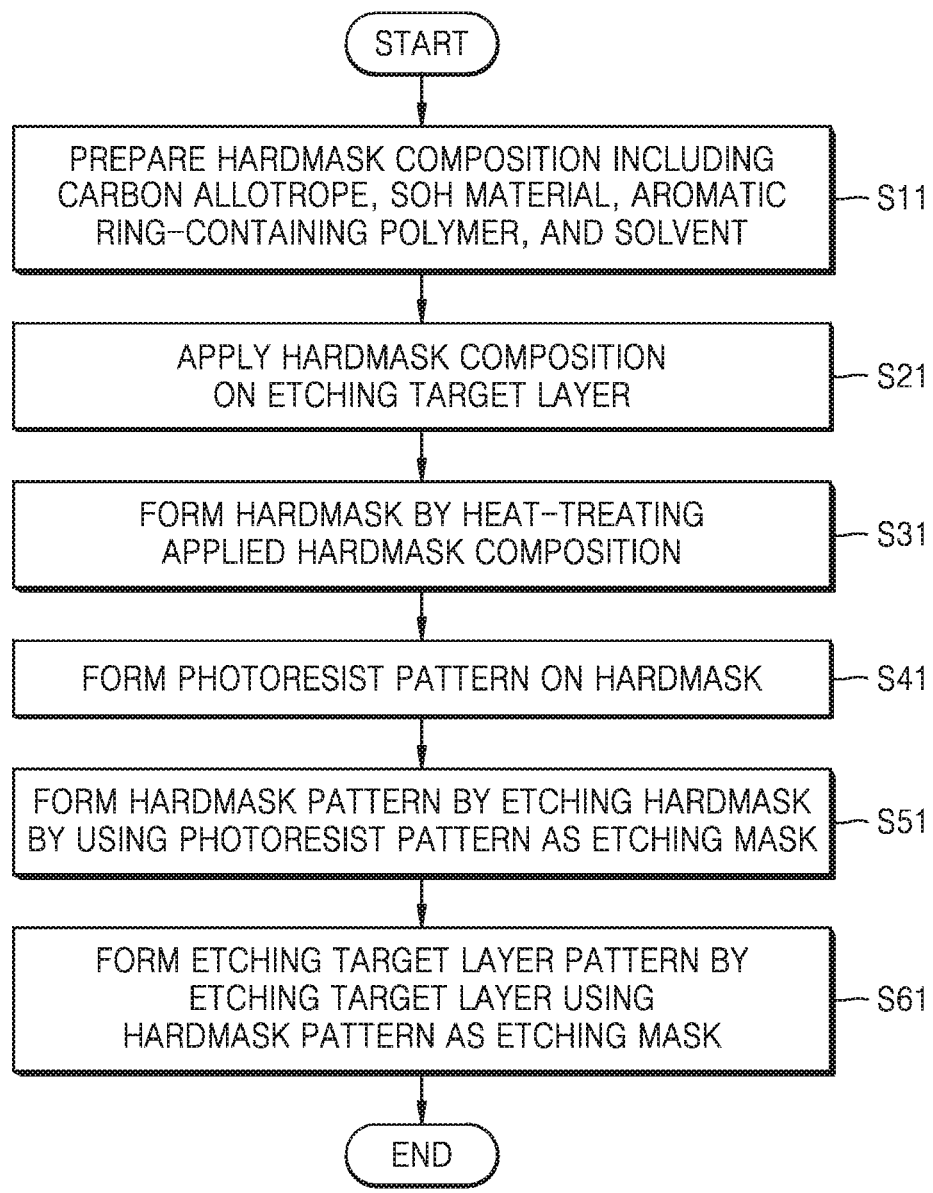
FIG. 1 is a flowchart of a method of forming patterns for a semiconductor device, according to an example embodiment.

FIG. 1 is a flowchart of a method of forming patterns for a semiconductor device, according to an example embodiment.

FIG. 1 sequentially shows operation S11 of preparing a hardmask composition including a carbon allotrope, a spin-on hardmask (SOH) material, an aromatic ring-containing polymer, and a solvent, operation S21 of applying the hardmask composition to an etching target layer, operation S31 of forming a hardmask by heat-treating the applied hardmask composition, operation S41 of forming a photoresist pattern on the hardmask, operation S51 of forming a hardmask pattern by etching the hardmask using the photoresist pattern as an etching mask, and operation S61 of forming an etching target layer pattern by etching the etching target layer using the hardmask pattern as an etching mask.

Regarding operation S11, each of the materials constituting the hardmask composition will be described in detail as follows.

The carbon allotrope may include a fullerene, a carbon nanotube, graphene, carbon black, or a combination thereof. The carbon allotrope may be manufactured to have an average diameter of 1 nm to 50 nm, an average length of 100 nm to 300 nm, and a metal impurity content of 100 ppm or less. The carbon allotrope may include a single-wall structure, a double-wall structure, a multiple-wall structure, or a combination thereof. For example, when the carbon allotrope includes carbon nanotube, the carbon nanotube grown to a given or predetermined length may be cut to have an intended length and be used.

The SOH material may include an organic compound containing about 85 weight % to 99 weight % of carbon based on the total weight. The organic compound may include a hydrocarbon compound including an aromatic ring, such as phenyl, benzene, or naphthalene, or a derivative thereof. Alternatively, the SOH material may be obtained by polymerizing a fluorine-based monomer or fluorine-based, pyrene-based, and cyclohexane-based monomers under the existence of a thermal acid generator, and then, filtering, washing, and vacuum-drying a generated precipitate.

The aromatic ring-containing polymer may have a structure including an aromatic ring capable of absorbing light in a given or predetermined wavelength region. In this regard, the light in a given or predetermined wavelength region may be, for example, a relatively short wavelength region of about 193 nm or 243 nm. A weight average molecular weight of the aromatic ring-containing polymer may be about 2,000 to 30,000. Thus, soluble characteristics may be secured as the weight average molecular weight is within the above range.

Although the solvent is not particularly limited as long as the solvent is the one having sufficient soluble characteristics and dispersible characteristics regarding the carbon allotrope, the SOH material, and the aromatic ring-containing polymer, the solvent may include, for example, at least one selected from propylene glycol monomethyl ether acetate (PGMEA), propylene glycol monomethyl ether (PGME), cyclohexanone, and ethyl lactate. The solvent may be included as the remainder excluding the carbon allotrope, the SOH material, and the aromatic ring-containing polymer.

Selectively, the hardmask composition may further include an additive selected from the group including a cross-linker, a radical stabilizer, a surfactant, a pH regulator, and a combination thereof.

The hardmask composition according to one or more example embodiments may have a composition in which a weight ratio of the SOH material is greater than that of the carbon allotrope. For example, a weight ratio of the carbon allotrope to the SOH material may be about 1:9 to 2:8. Also, the carbon allotrope may be dispersed by the solvent, and the SOH material may be dissolved by the solvent. In other words, the hardmask composition may have different types of solubility characteristics including dispersible characteristics and soluble characteristics.

In operation S21, the hardmask composition is applied on the etching target layer. The etching target layer and the application method will be described in detail as follows.

The etching target layer may include a semiconductor substrate. In some example embodiments, the etching target layer may include a conductive layer, a dielectric layer, an insulating layer, or a combination thereof formed on a semiconductor substrate. For example, the etching target layer may include metal, an alloy, metal carbide, metal nitride, metal oxynitride, metal oxycarbide, a semiconductor, polysilicon, silicon oxide, silicon nitride, silicon oxynitride, or a combination thereof. However, the present disclosure is not limited thereto.

The hardmask composition may be manufactured as a solution and thus may be applied on the etching target layer by a spin-on coating method. Although an application thickness of the hardmask composition is not particularly limited, the hardmask composition may be applied to have, for example, a thickness of about 500 Å to 7,000 Å.

Regarding operation S31, a heat treatment condition regarding the applied hardmask composition is not particularly limited. However, for example, the applied hardmask composition may be heat-treated at a temperature of about 100 to 500° C. for about 10 seconds to 10 minutes.

In operation S41, in order to form a photoresist pattern, a photoresist layer may be formed by coating the etching target layer with a photoresist composition including a photosensitive polymer, a photoacid generator (PAG), a solvent, etc., and then, a photoresist pattern may be formed by performing exposure and development processes. Spin-on coating, spray coating, deep coating, etc. may be used for coating the photoresist composition. However, the present disclosure is not limited thereto.

In operation S51, the hardmask is etched using the photoresist pattern as an etching mask, to form an intended hardmask pattern. In some example embodiments, an anti-reflection coating layer may be formed on the hardmask. Accordingly, each of the anti-reflection coating layer and the hardmask may be etched using the photoresist pattern as an etching mask, thereby forming a reflection inhibiting pattern and a hardmask pattern.

In operation S61, the etching target layer is etched using the hardmask pattern as an etching mask, thereby obtaining an etched pattern, and the etched pattern may be used to configure various elements necessary to implement an integrated circuit device.

In some example embodiments, the etched pattern may be an active region defined on a substrate of the semiconductor device. In some example embodiments, the etched pattern may include a plurality of hole patterns or a line and space pattern. In some example embodiments, the etched pattern may include a conductive pattern or an insulating pattern. For example, the conductive pattern may configure a plurality of bit line forming patterns, a plurality of direct contact forming patterns, a plurality of buried contact forming patterns, a plurality of capacitor lower electrode forming patterns arranged in a cell array region of an integrated circuit device, or a plurality of conductive patterns arranged in a core region of an integrated circuit device. Detailed descriptions thereof will be made later with reference to FIGS. 12 to 18.

Figure 2:
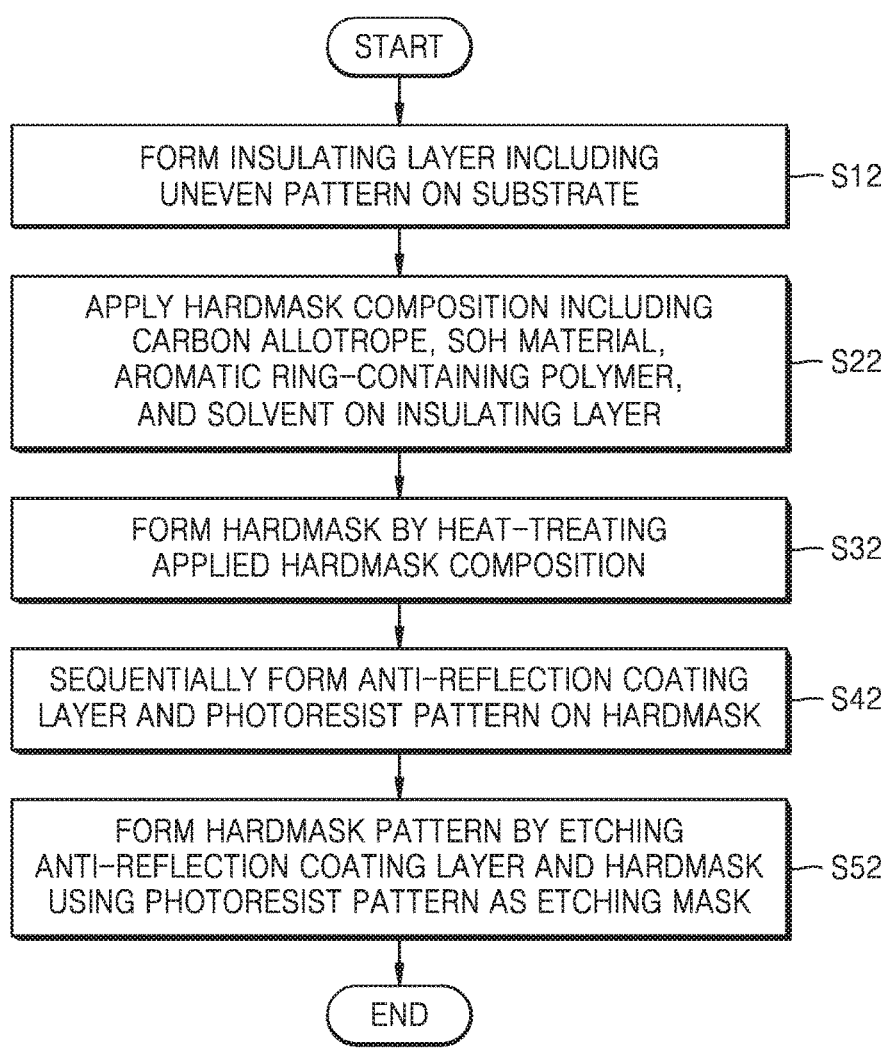
FIG. 2 is a flowchart of a method of forming patterns for a semiconductor device, according to another example embodiment.

FIG. 2 is a flowchart of a method of forming patterns for a semiconductor device, according to another example embodiment.

FIG. 2 sequentially shows operation S12 of forming an insulating (i.e., etching target) layer including an uneven pattern on a substrate, operation S22 of applying a hardmask composition including a carbon allotrope, an SOH material, an aromatic ring-containing polymer, and a solvent on the insulating (i.e., etching target) layer, operation S32 of forming a hardmask by heat-treating the applied hardmask composition, operation S42 of sequentially forming an anti-reflection coating layer and a photoresist pattern on the hardmask, and operation S52 of forming a hardmask pattern by etching the anti-reflection coating layer and the hardmask using the photoresist pattern as an etching mask.

Regarding operation S12, the substrate and the etching target layer including an uneven pattern will be described in detail as follows.

The substrate may be a semiconductor substrate. In some example embodiments, the substrate may include a semiconductor such as Si or Ge. In some example embodiments, the substrate may include a compound semiconductor such as SiGe, SiC, GaAs, InAs, or InP. In some example embodiments, the substrate may have a silicon on insulator (SOI) structure. The substrate may include a conductive region, for example, a well doped with impurities, or a structure doped with impurities. Also, the substrate may have various device isolation structures including a shallow trench isolation (STI) structure.

The etching target layer includes the same material as described with regard to operation S21 of FIG. 1, and the uneven pattern may include a hole pattern having an opening exposed at an upper surface of the etching target layer. Also, an average diameter of the opening may be less than an average length of the carbon allotrope constituting the hardmask composition that is to be applied in operation S22. However, the uneven pattern is not limited thereto.

Operation S22 and operation S32 are respectively similar to operation S21 and operation S31 of FIG. 1 described above, and thus, detailed descriptions thereof will be omitted herein.

In operation S42, during a photolithography process for forming a photoresist pattern, light reflected from a surface or interface of the substrate, the etching target layer, or the hardmask may be absorbed or be offset due to an interference effect by the anti-reflection coating layer.

The anti-reflection coating layer may include an inorganic anti-reflection coating layer, an organic anti-reflection coating layer, or a combination thereof. For example, the anti-reflection coating layer may include an inorganic material including SiON or an organic polymer. When the anti-reflection coating layer includes an organic material, the anti-reflection coating layer may be formed by a coating method. When the anti-reflection coating layer includes an inorganic material, the anti-reflection coating layer may be formed by a deposition method.

Parts that have not been described herein are similar to those described above with regard to operation S41 of FIG. 1, and thus, detailed descriptions thereof will be omitted herein.

In operation S52, the anti-reflection coating layer and the hardmask may be etched using the photoresist pattern as an etching mask, thereby forming a hardmask pattern. Other parts that have not been described are similar to those described above with regard to operation S51 of FIG. 1, and thus, detailed descriptions thereof will be omitted herein.

FIGS. 3 to 8 are cross-sectional views according to a process sequence in order to describe a method of forming patterns for a semiconductor device, according to an example embodiment.

Figure 3:
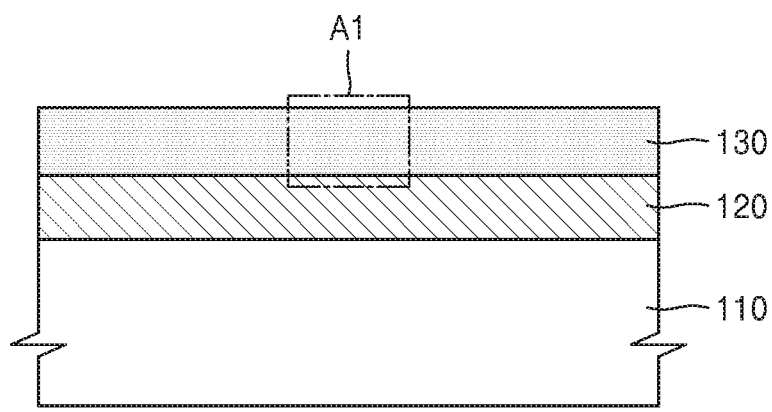
FIGS. 3 to 8 are cross-sectional views according to a process sequence in order to describe a method of forming patterns for a semiconductor device, according to an example embodiment.

Referring to FIG. 3, a hardmask 130 is formed on an etching target layer 120 formed on a substrate 110.

The substrate 110 may be a semiconductor substrate. The substrate 110 is the same as described above with regard to operation S12 of FIG. 2, and thus, detailed descriptions thereof will be omitted herein. In example embodiments, an example in which the substrate 110 is a silicon substrate will be described.

The etching target layer 120 may be an insulating layer or a conductive layer. The etching target layer 120 includes the same material described above with regard to operation S21 of FIG. 1, and thus, detailed descriptions thereof will be omitted herein. However, when a pattern to be ultimately formed is realized on the substrate 100, the etching target layer 120 may be omitted.

The hardmask 130 may be formed on the etching target layer 120 to a uniform thickness. The hardmask 130 is formed by manufacturing a hardmask composition as a solution, applying the hardmask composition to the etching target layer 120 using a spin-on coating method, and heat-treating the applied hardmask composition at a temperature of about 100 to 500° C. for about 10 seconds to 10 minutes.

Figure 4:
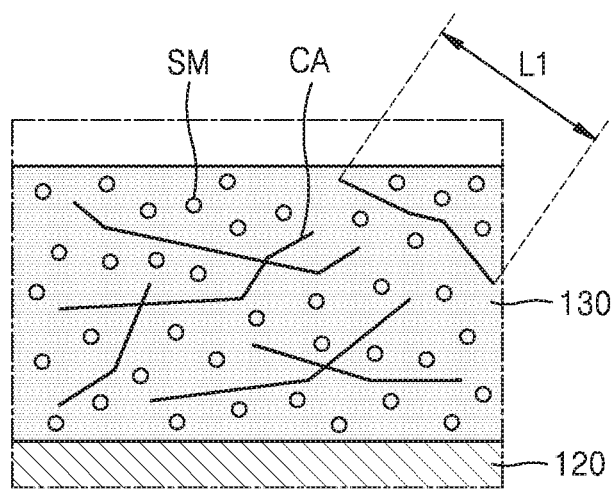

FIG. 4 is an enlarged view of portion A1 of FIG. 3. Referring to FIG. 4, the hardmask 130 may include a carbon allotrope CA and an SOH material SM.

In order to apply the hardmask 130 on the etching target layer 120 to a uniform thickness, the carbon allotrope CA may have an average diameter of about 1 nm to 50 nm and an average length of about 100 nm to 300 nm. For example, the carbon allotrope CA may include a fullerene, a carbon nanotube, graphene, carbon black, or a combination thereof. A coating layer having a uniform thickness of about 200 to 400 nm may be formed using the carbon allotrope CA with an average length of about 100 to 300 nm.

The hardmask 130 according to one or more example embodiments may include the carbon allotrope CA containing at least 90 weight % of carbon and the SOH material SM containing about 85 weight % to 99 weight % of carbon so that an etching resistance of the hardmask 130 is increased. The hardmask 130 according to one or more example embodiments may include the carbon allotrope CA with an average length of about 100 nm to 300 nm and an aromatic ring-containing polymer so that a density of the hardmask 130 is increased and a surface toughness thereof is decreased. The hardmask 130 according to one or more example embodiments may include the carbon allotrope CA with a metal impurity content of 100 ppm or less so that an amount of impurities in the hardmask 130 is reduced or minimized to inhibit or prevent contamination of other materials of the semiconductor device.

An etching resistance of the hardmask 130 may be the same as or similar to that of an amorphous carbon layer (ACL).

Also, by constituting the hardmask 130 by mixing the carbon allotrope CA and the SOH material SM, the hardmask 130 having all of the characteristics such as alleviation of a void defect, improved gap-fill characteristics, and inhibition or prevention of step formation, which may be difficult to obtain by independently using each of these materials, may be formed.

The carbon allotrope CA may be, for example, a carbon nanotube. The carbon nanotube may include a single-wall structure, a double-wall structure, a multiple-wall structure, a chemically transformed carbon nanotube, a metallic carbon nanotube, a semiconductor carbon nanotube, a metalized carbon nanotube, or a combination thereof.

Figure 5:
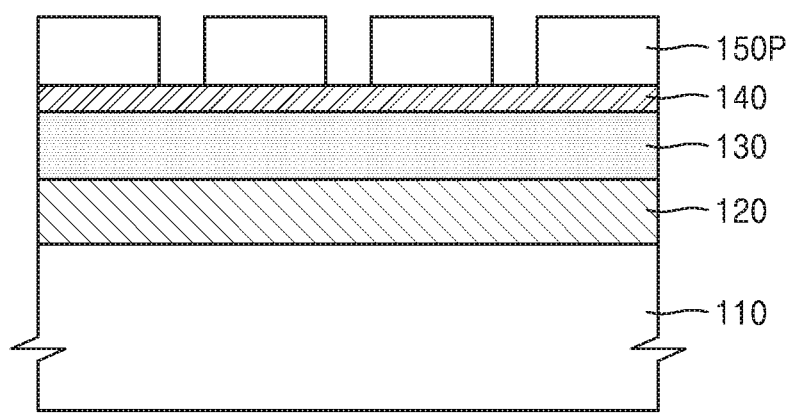

Referring to FIG. 5, an anti-reflection coating layer 140 and a photoresist pattern 150P are sequentially formed on the hardmask 130.

The anti-reflection coating layer 140 may include an inorganic anti-reflection coating layer, an organic anti-reflection coating layer, or a combination thereof. In some example embodiments, the anti-reflection coating layer 140 may be omitted. A thickness of the anti-reflection coating layer 140 may be, for example, about 100 nm to 500 nm. However, the present disclosure is not limited thereto.

The photoresist pattern 150P may have a line and space pattern. Although FIG. 5 illustrates the photoresist pattern 150P having a linear plan structure having a certain width in a length direction, the inventive concepts are not limited thereto. For example, the photoresist pattern 150P may have various patterns such as a curved type or a zigzag type, and in some example embodiments, may have a variable width in the length direction.

Figure 6:
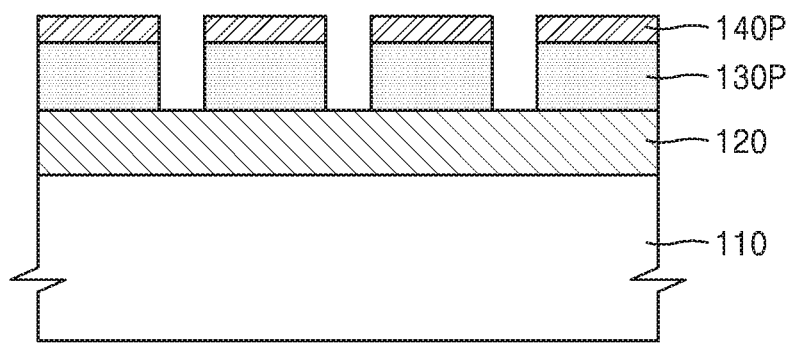

Referring to FIG. 6, the anti-reflection coating layer 140 (refer to FIG. 5) and the hardmask 130 (refer to FIG. 5) may be etched using the photoresist pattern 150P (refer to FIG. 5) as an etching mask, to respectively form a reflection inhibiting pattern 140P and a hardmask pattern 130P. In some example embodiments, the anti-reflection coating layer 140 may be omitted, and thus, the reflection inhibiting pattern 140P may be omitted.

Figure 7:
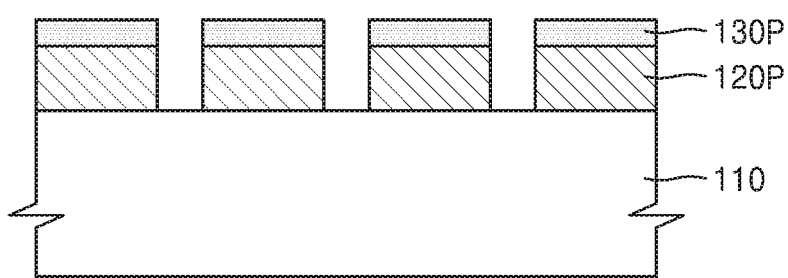

Referring to FIG. 7, unnecessary layers on the hardmask pattern 130P are removed, and then, the etching target layer 120 is etched using the hardmask pattern 130P as an etching mask, thereby forming an etched pattern 120P so as to expose an upper surface of the substrate 110. In some example embodiments, the etched pattern 120P may be formed so as not to expose the upper surface of the substrate 110.

Figure 8:
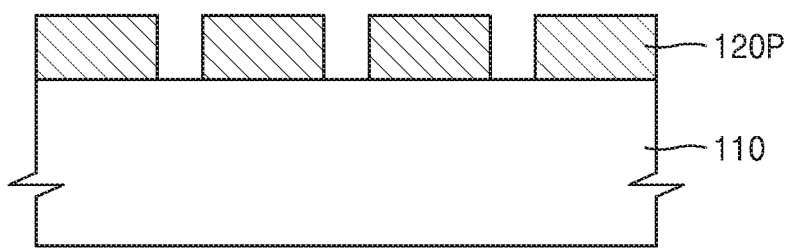

Referring to FIG. 8, the hardmask pattern 130P (refer to FIG. 7) remaining on the etched pattern 120P may be removed.

In some example embodiments, the hardmask pattern 130P (refer to FIG. 7) may not be removed. The etched pattern 120P may configure various patterns including a metal pattern, a semiconductor pattern, or an insulator pattern. The completed etched pattern 120P may be used to perform an intended semiconductor device formation process.

As described above, according to a method of forming patterns for a semiconductor device, according to example embodiments of the inventive concepts, an etching resistance of a hardmask may be increased using a carbon allotrope containing at least 90 weight % of carbon and an SOH material containing about 85 weight % to 99 weight % of carbon, and the hardmask having all of the necessary characteristics such as alleviation of a void defect, improved gap-fill characteristics, and inhibition or prevention of step formation, which may be difficult to obtain by independently using each of these materials, may be formed by constituting the hardmask by mixing the carbon allotrope and the SOH material. Fine patterns of a highly integrated semiconductor device may be more easily realized using the hardmask having such characteristics as described above.

Figure 9:
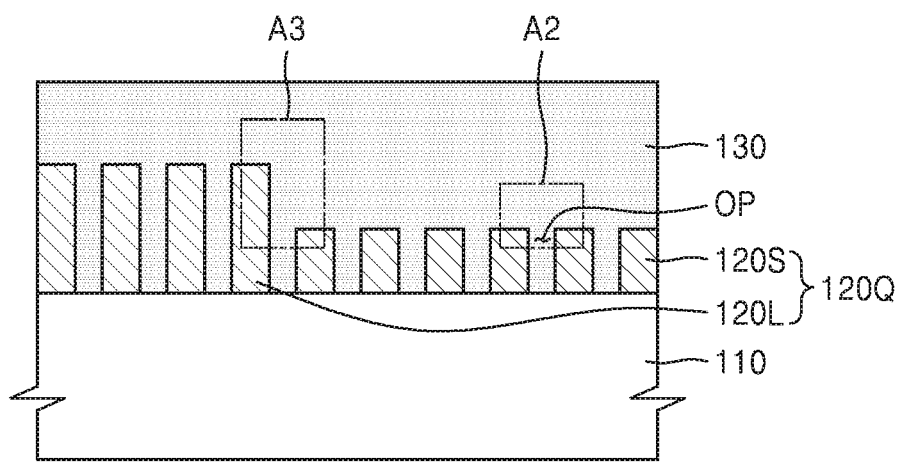
FIGS. 9 to 11 are cross-sectional views according to a process sequence in order to describe a method of forming patterns for a semiconductor device, according to another example embodiment.
Figure 10:
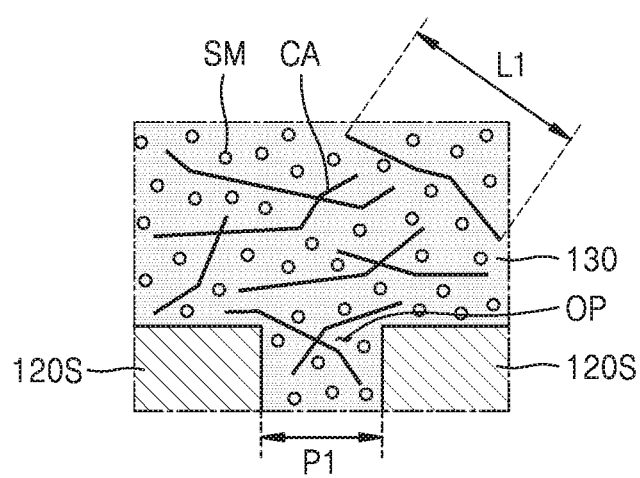
Figure 11:
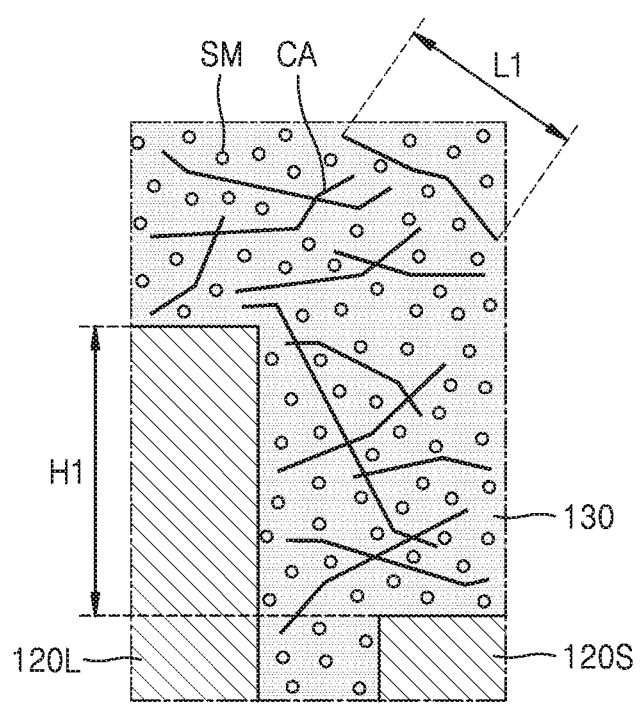

FIGS. 9 to 11 are cross-sectional views according to a process sequence in order to describe a method of forming patterns for a semiconductor device, according to another embodiment.

Referring to FIG. 9, a hardmask 130 is formed on an etching target layer 120Q on a substrate 110.

The substrate 110 may be a semiconductor substrate. The substrate 110 is the same as described above with regard to operation S12 of FIG. 2, and thus, detailed descriptions thereof will be omitted herein. In the present embodiment, an example in which the substrate 110 is a silicon substrate will be described.

The etching target layer 120Q may be an insulating layer or a conductive layer. The etching target layer 120Q may include the same material as described above with regard to operation S21 of FIG. 1, and thus, detailed descriptions thereof will be omitted herein.

The etching target layer 120Q may include an uneven pattern. The etching target layer 120Q may include a first etching target layer 120S including uneven patterns arranged at identical intervals and a second etching target layer 120L thicker than the first etching target layer 120S. However, the present disclosure is not limited thereto.

The uneven pattern may include a hole pattern having an opening OP exposed at an upper surface of the etching target layer 120Q. Alternatively, the uneven pattern may be a line and space pattern.

The hardmask 130 may cover the etching target layer 120Q including the uneven pattern, and an upper surface of the hardmask 130 may be substantially flat. That is, the hardmask 130 may be formed on the etching target layer 120Q so as to have a uniform thickness from an upper surface of the substrate 110. The hardmask 130 may be formed by manufacturing a hardmask composition as a solution, applying the hardmask composition to the etching target layer 120Q using a spin-on coating method, and heat-treating the applied hardmask composition at a temperature of about 100 to 500° C. for about 10 seconds to 10 minutes.

FIG. 10 is an enlarged view of portion A2 of FIG. 9. Referring to FIG. 10, the hardmask 130 including a carbon allotrope CA and an SOH material SM may be formed on the first etching target layer 120S.

In order to apply the hardmask 130 on the first etching target layer 120S so as to have a uniform thickness, the carbon allotrope CA may have an average diameter of about 1 to 50 nm and an average length of about 100 to 300 nm. For example, the carbon allotrope CA may include a fullerene, a carbon nanotube, graphene, carbon black, or a combination thereof. A coating layer having a uniform thickness of about 200 to 400 nm may be formed using the carbon allotrope CA with an average length of about 100 to 300 nm.

In the first etching target layer 120S, an uneven pattern may include a hole pattern having the opening OP exposed at the upper surface of the etching target layer 120Q, and an average diameter P1 of the opening OP may be less than an average length L1 of the carbon allotrope CA.

Since the average length L1 of the carbon allotrope CA is greater than the average diameter P1 of the opening OP, overlapping places of carbon allotropes CA exist spaced apart from each other. Accordingly, the carbon allotropes CA may be formed around the first etching target layer 120S so as to have a net shape, and the SOH material SM may be disposed between the carbon allotropes CA. That is, the carbon allotrope CA and the SOH material SM may efficiently fill the opening OP of the uneven pattern formed in the first etching target layer 120S, thereby inhibiting or preventing formation of a void.

Also, when the hardmask 130 is formed such that a weight ratio of the SOH material SM is greater than that of the carbon allotrope CA, a content of the SOH material SM relatively smaller than the carbon allotrope CA and the uneven pattern is relatively high, and thus, gap-fill capability of the hardmask 130 may improve. For example, the hardmask 130 may be formed such that a weight ratio of the carbon allotrope CA to the SOH material SM is about 1:9 to 2:8.

FIG. 11 is an enlarged view of portion A3 of FIG. 9. Referring to FIG. 11, the hardmask 130 including the carbon allotrope CA and the SOH material SM may be formed on the first etching target layer 120S and the second etching target layer 120L.

In order to apply the hardmask 130 on the first etching target layer 120S and the second etching target layer 120L so as to have a uniform thickness, the carbon allotrope CA may have an average diameter of about 1 to 50 nm and an average length of about 100 to 300 nm.

As the hardmask 130 includes the carbon allotrope CA relatively longer than the SOH material SM, carbon allotropes CA may overlap each other and serve as a bridge between the first etching target layer 120S and the second etching target layer 120L. Accordingly, influence of a step HI between the first etching target layer 120S and the second etching target layer 120L may be reduced or minimized, and thus, an upper surface of the hardmask 130 may be substantially flat.

As described above with regard to FIGS. 10 and 11, according to a method of forming patterns for a semiconductor device, according to the inventive concepts, the hardmask 130 having all the characteristics, such as void improvement, gap-fill improvement, and step improvement, that each of the materials is difficult to independently exhibit may be formed by mixing the carbon allotrope CA and the SOH material SM to configure the hardmask 130.

Although not illustrated, an etched pattern having a different shape from the uneven pattern may be formed by forming a hardmask pattern in the hardmask 130 using a method similar to that described with regard to FIGS. 4 to 6 and then etching the etching target layer 120Q with the hardmask pattern as an etching mask. For example, when the uneven pattern is a hole pattern, the etched pattern may be a line and space pattern.

The etched pattern may configure various patterns such as a metal pattern, a semiconductor pattern, an insulator pattern, etc. An intended fine pattern formation process may be performed using the uneven pattern and the etched pattern having a different shape from the uneven pattern.

When a weight ratio of the carbon allotrope CA to the SOH material SM is about 1:9 to 2:8, the hardmask 130 capable of gap-filling the uneven pattern of the etching target layer 120Q without a void may be formed.

When a weight ratio of the carbon allotrope CA is below the range, the capability of improving a step may be degraded. On the other hand, when a weight ratio of the carbon allotrope CA is above the range, the capability of improving gap-fill may be degraded. However, the inventive concepts do not limit a weight ratio of the carbon allotrope CA to the SOH material SM to the above range, and if necessary, the range may be changed.

Figure 12:
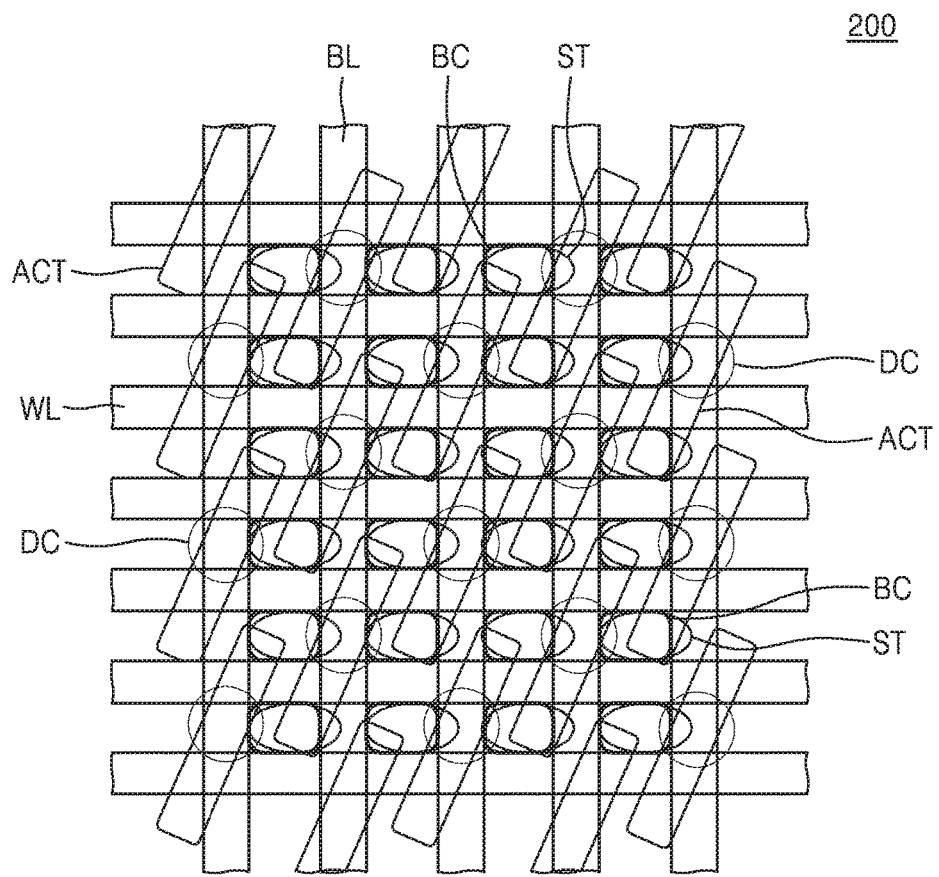
FIG. 12 is an example plan layout of an integration circuit device that may be obtained using a method of forming patterns for a semiconductor device, according to example embodiments of the inventive concepts.

FIG. 12 is an example plan layout of an integration circuit device that may be obtained using a method of forming patterns for a semiconductor device, according to the inventive concepts. The layout illustrated in FIG. 12 may configure a memory cell array region of a semiconductor memory device.

Referring to FIG. 12, a memory cell array region of an integrated circuit device 200 includes a plurality of active regions ACT. A plurality of word lines WL cross the plurality of active regions ACT and extend mutually parallel in a first direction (direction X). The plurality of word lines WL may be arranged at the same intervals as each other. On the plurality of word lines WL, a plurality of bit lines BL extend mutually parallel in a second direction (direction Y) perpendicular to the first direction.

The plurality of bit lines BL are connected to the plurality of active regions ACT via a plurality of direct contacts DC.

A plurality of buried contacts BC may each include a contact structure extending from a region between two neighbouring bit lines BL from among the plurality of bit lines BL to an upper portion of one of the two neighbouring bit lines BL. In some example embodiments, the plurality of buried contacts BC may be arranged in a row in the first direction (direction X) and the second direction (direction Y). In some example embodiments, the plurality of buried contacts BC may be arranged at the same intervals in the second direction (direction Y). The plurality of buried contacts BC may electrically connect a lower electrode ST of a capacitor to an active region ACT.

Methods of forming patterns for a semiconductor device, according to example embodiments, described with reference to FIGS. 1 to 11 may be used to form unit devices illustrated in FIG. 12, for example, the plurality of active regions ACT, the plurality of word lines WL, the plurality of bit lines BL, the plurality of direct contacts DC, the plurality of buried contacts BC, a plurality of lower electrodes ST, etc.

FIGS. 13 to 18 are cross-sectional views according to a process sequence for describing a detailed example of a method of manufacturing an integrated circuit device using a method of forming patterns for a semiconductor device, according to example embodiments of the inventive concepts.

In FIGS. 13 to 18, elements that are the same as those in FIGS. 3 to 11 are designated by the same reference numerals, and thus, detailed descriptions thereof will be omitted herein.

Figure 13:
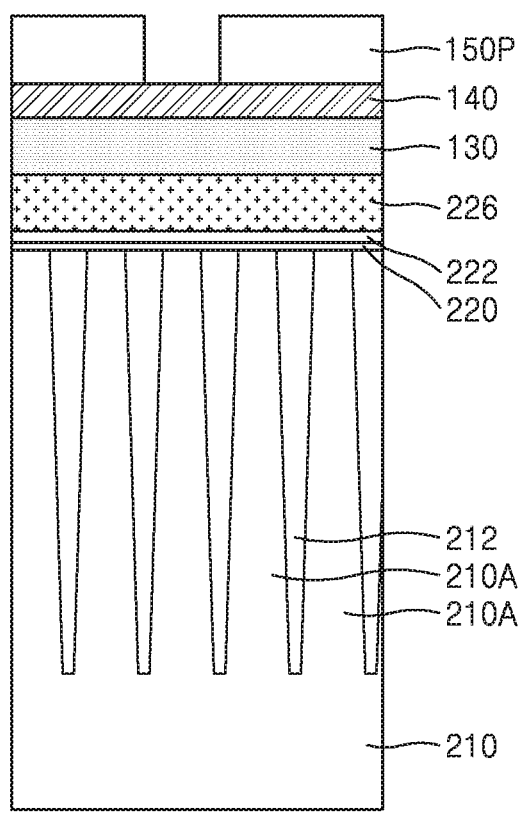
FIGS. 13 to 18 are cross-sectional views according to a process sequence for describing a detailed example of a method of manufacturing an integrated circuit device using a method of forming patterns for a semiconductor device, according to example embodiments of the inventive concepts.

Referring to FIG. 13, a device isolation layer 212 is formed in a substrate 210 to define a plurality of active regions 210A, and a first conductive layer 226, the hardmask 130, the anti-reflection coating layer 140, and the photoresist pattern 150P are sequentially formed above the substrate 210.

Detailed descriptions of the substrate 210 are the same as those of the substrate 110 with reference to FIG. 2.

Like the active region ACT illustrated in FIG. 12, each of the plurality of active regions 210A may have a relatively long island shape with a short axis and a long axis. One of the methods of forming patterns for a semiconductor device, according to example embodiments, described with reference to FIGS. 1 to 11 may be used in order to define the plurality of active regions 210A.

The device isolation layer 212 may include a silicon oxide layer, a silicon nitride layer, or a combination thereof. However, the present disclosure is not limited thereto. The device isolation layer 212 may include a single layer including one type of insulating layer, or a multiple layer including a combination of at least two types of insulating layers.

A plurality of word line trenches (not shown) are formed in the substrate 210. The plurality of word line trenches extend mutually parallel in the direction X of FIG. 12, and may have line shapes respectively crossing the plurality of active regions 210A. A plurality of gate dielectric layers, the plurality of word lines WL (refer to FIG. 12), and a plurality of buried insulating layers are sequentially formed in the plurality of word line trenches.

In some example embodiments, after forming the plurality of word lines WL, source/drain regions may be formed on an upper surface of the plurality of active regions 210A by injecting impure ions into the substrate 210 at both sides of the plurality of word lines WL. In some example embodiments, before forming the plurality of word lines WL, an impure ion injection process for forming source/drain regions may be performed.

A first insulating layer 220 and a second insulating layer 222 are sequentially formed on the substrate 210. The first insulating layer 220 may include a silicon oxide layer, and the second insulating layer 222 may include a silicon nitride layer. However, the present disclosure is not limited thereto.

Although the first conductive layer 226 may include doped polysilicon, the present disclosure is not limited thereto.

By a method similar to that described with reference to FIGS. 1 to 11, the hardmask 130, the anti-reflection coating layer 140, and the photoresist pattern 150P are sequentially formed on the first conductive layer 226.

Figure 14:
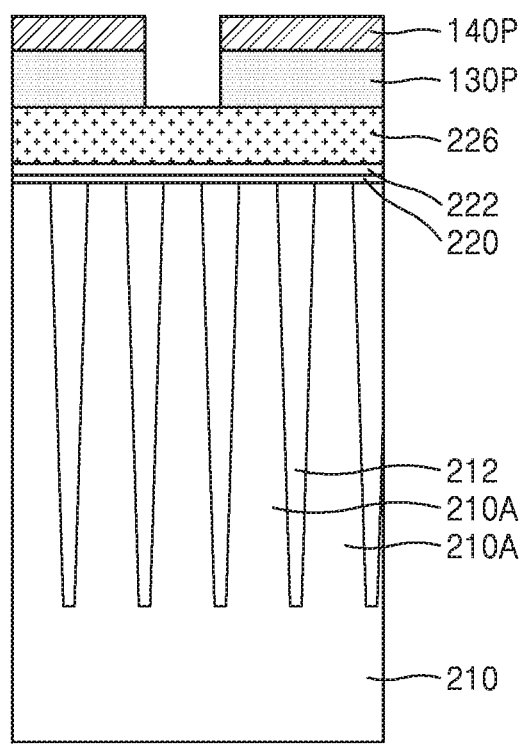

Referring to FIG. 14, by a method similar to that described with reference to FIGS. 1 to 11, the anti-reflection coating layer 140 and the hardmask 130 are etched using the photoresist pattern 150P of FIG. 13 as an etching mask, and thus, the reflection inhibiting pattern 140P and the hardmask pattern 130P are formed.

Figure 15:
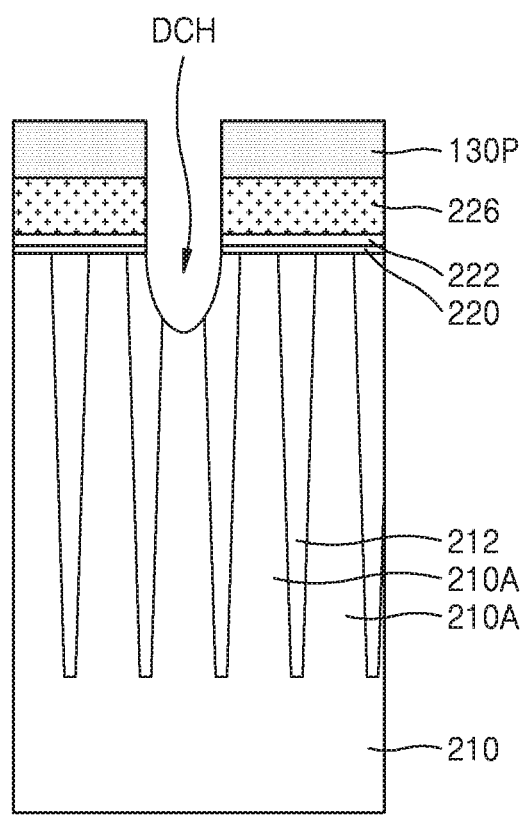

Referring to FIG. 15, after removing unnecessary layers on the hardmask pattern 130P, the first conductive layer 226 is etched using the hardmask pattern 130P as an etching mask, and a portion of the substrate 210 and a portion of the device isolation layer 212 that are exposed as a result are etched to form a direct contact hole DCH exposing an active region 210A of the substrate 210.

Figure 16:
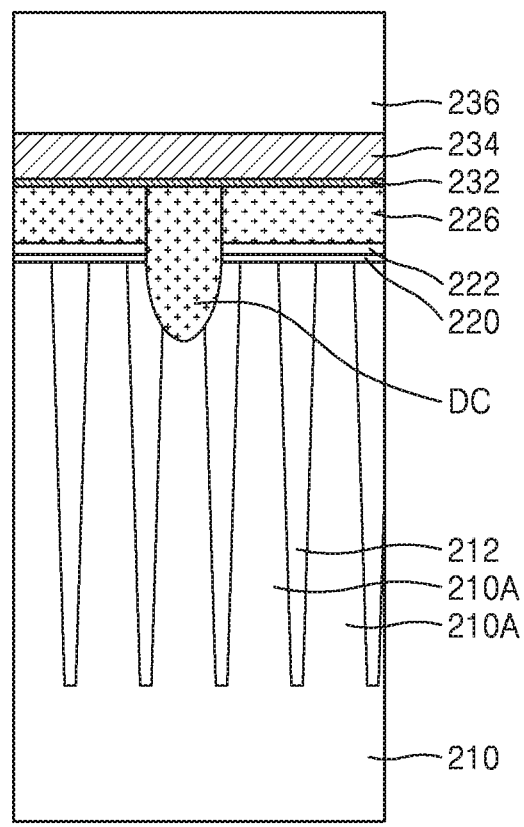

Referring to FIG. 16, a direct contact DC filling the direct contact hole DCH is formed, and a third conductive layer 232, a fourth conductive layer 234, and an insulating capping layer 236 are sequentially formed on the first conductive layer 226 and the direct contact DC.

In order to form the direct contact DC, the hardmask pattern 130P (refer to FIG. 15) is removed, and then, a second conductive layer that is thick enough to fill the direct contact hole DCH is formed in the direct contact hole DCH and on the first conductive layer 226. By etching back the second conductive layer so that the second conductive layer may remain only in the direct contact hole DCH, the direct contact DC including the second conductive layer remaining in the direct contact hole DCH is formed. Although the direct contact DC may include doped polysilicon, the present disclosure is not limited thereto.

Each of the third conductive layer 232 and the fourth conductive layer 234 may include TiN, TiSiN, W, tungsten silicide, or a combination thereof. However, the present disclosure is not limited thereto. In some example embodiments, the third conductive layer 232 may include TiSiN, and the fourth conductive layer 234 may include W. The insulating capping layer 236 may include a silicon nitride layer.

Figure 17:
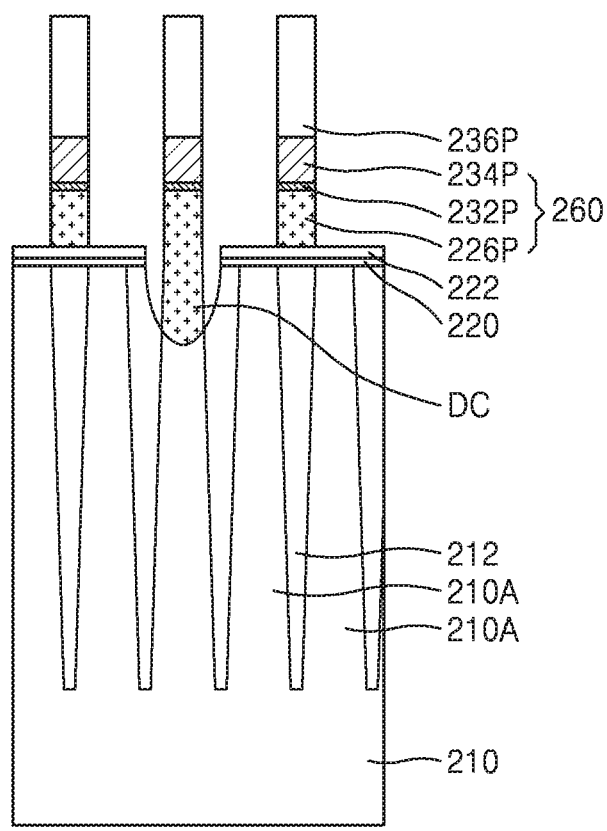

Referring to FIG. 17, the insulating capping layer 236 is patterned by a photolithography process to form an insulating capping pattern 236P, and a portion of a lower structure is etched using the insulating capping pattern 236P as an etching mask, to form a plurality of bit lines 260.

In some example embodiments, one of the methods of forming patterns for a semiconductor device, described with reference to FIGS. 1 to 11, may be used in order to form the insulating capping pattern 236P.

In order to form the plurality of bit lines 260, portions of the fourth conductive layer 234, the third conductive layer 232, the first conductive layer 226, and the direct contact DC are sequentially etched using the insulating capping pattern 236P as an etching mask, and thus, the plurality of bit lines 260 including a first conductive pattern 226P, a third conductive pattern 232P, and a fourth conductive pattern 234P are formed. The plurality of bit lines 260 may be connected to the active region 210A of the substrate 210 via the direct contact DC.

Figure 18:
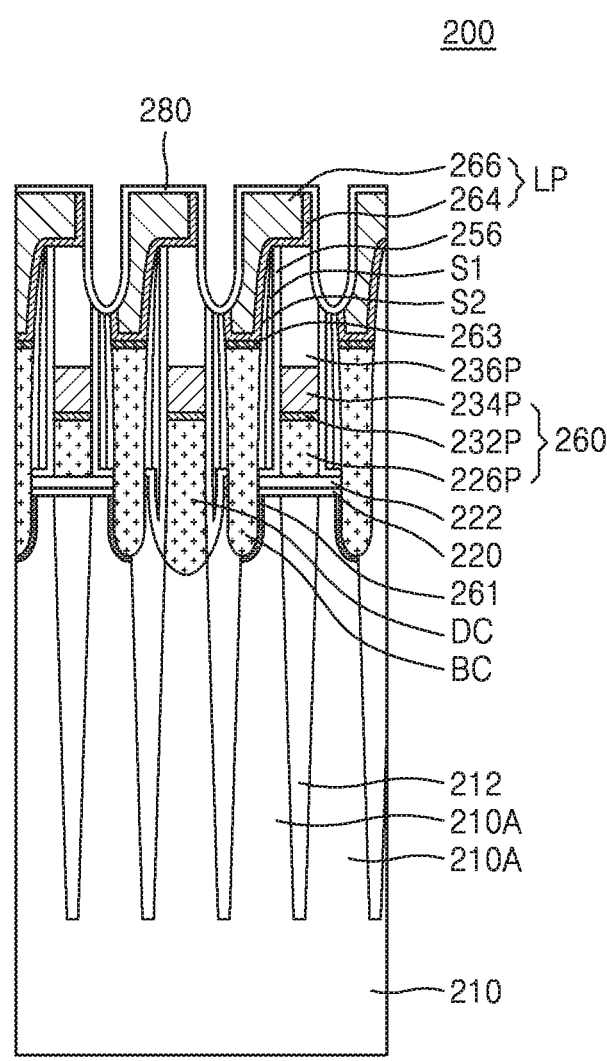

Referring to FIG. 18, an insulating liner 256 is formed on an exposed upper surface of a result in which the plurality of bit lines 260 are formed, and the plurality of buried contacts BC (refer to FIG. 12) and a plurality of conductive landing pads LP connected to the plurality of buried contacts BC are formed in spaces between the plurality of bit lines 260.

Although the insulating liner 256 may include a silicon nitride layer, the present disclosure is not limited thereto.

After insulating spacers SI and S2 covering the insulating liner 256 at a side wall of each of the plurality of bit lines 260 are formed, and a plurality of insulating patterns (not shown in the cross-sectional view of FIG. 18) limiting a plurality of holes for forming the plurality of buried contacts BC in the spaces between the plurality of bit lines 260 are formed, the plurality of active regions 210A of the substrate 210 are exposed via the plurality of holes, and a metal silicide layer 261 is formed on a surface of each of the exposed active regions 210A. Then, a conductive layer is filled in a lower portion of each of the plurality of holes to form the plurality of buried contacts BC respectively connected to the active regions 210A. The plurality of insulating patterns may include a silicon nitride layer, a silicon oxide layer, or a combination thereof.

In some example embodiments, the metal silicide layer 261 may include cobalt silicide. However, according to the inventive concepts, the metal silicide layer 261 is not limited to the example material and may include a material selected from among various types of metal silicides. In some example embodiments, the plurality of buried contacts BC may include doped polysilicon. In some example embodiments, the metal silicide layer 261 may be omitted.

In some example embodiments, the insulating spacers S1 and S2 may include a silicon oxide layer, a silicon nitride layer, air, or a combination thereof. In some example embodiments, the insulating spacers SI and S2 is a double layer. However, the inventive concepts are not limited thereto, and the insulating spacers SI and S2 may be a single layer or multiple layers.

Thereafter, metal silicide layers 263 are formed on the plurality of buried contacts BC in the plurality of holes between the plurality of bit lines 260. In some example embodiments, a metal silicide layer 263 may include cobalt silicide. However, according to the inventive concepts, the metal silicide layer 263 is not limited to the example material and may include a material selected from among various types of metal silicides. In some example embodiments, the metal silicide layer 263 may be omitted.

Thereafter, a conductive barrier layer and a conductive layer are formed, and the conductive barrier layer and the conductive layer are etched back to expose the insulating liner 256. As a result, a portion of the conductive barrier layer and a portion of the conductive layer remain as a conductive barrier layer 264 and a conductive layer 266 filling each of the plurality of holes on the metal silicide layer 263 and covering each of the plurality of bit lines 260.

In some example embodiments, the conductive barrier layer 264 may include a stacked structure of Ti/TiN. In some example embodiments, the conductive layer 266 may include doped polysilicon, metal, metal silicide, conductive metal nitride, or a combination thereof.

Thereafter, in a cell array region, a mask pattern (not shown) partially exposing the conductive layer 266 is formed on the conductive layer 266, and then, the conductive barrier layer 264, the conductive layer 266, and surrounding insulating layers are etched using the mask pattern as an etching mask, and thus, the plurality of landing pads LP including remaining portions of the conductive barrier layer 264 and the conductive layer 266 are formed.

In a similar way to the plurality of buried contacts BC illustrated in FIG. 12, the plurality of landing pads LP may have a plurality of island shapes spaced apart from each other.

A photolithography process may be used to form the plurality of landing pads LP. In this regard, one of the methods of forming patterns for a semiconductor device, described with reference to FIGS. 1 to 11 may be used in order to form the plurality of landing pads LP.

Thereafter, an insulating thin film 280 is formed on an upper surface of a result including the plurality of conductive landing pads LP. Although the insulating thin film 280 may include a silicon nitride layer, the present disclosure is not limited thereto.

Thereafter, an insulating layer may be formed on the insulating thin film 280, and a plurality of capacitor lower electrodes electrically connectable to the plurality of conductive landing pads LP may be formed at the cell array region to form the integrated circuit device 200. Each of the plurality of capacitor lower electrodes may correspond to the lower electrode ST of FIG. 12.

While the inventive concepts have been particularly shown and described with reference to example embodiments thereof, it will be understood by those of ordinary skill in the art that various changes in form and details may be made therein without departing from the spirit and scope of the following claims. Therefore, example embodiments described herein should be considered in a descriptive sense only and not for purposes of limitation.

What is claimed is:

1. A method of forming patterns for a semiconductor device, the method comprising:
   preparing a hardmask composition including a carbon allotrope, a spin-on hardmask (SOH) material, and a solvent;
   applying the hardmask composition to an etching target layer, the etching target layer including a plurality of openings exposing an underlying substrate;
   forming a hardmask by heat-treating the applied hardmask composition;
   forming a photoresist pattern on the hardmask;
   forming a hardmask pattern by etching the hardmask using the photoresist pattern as an etching mask; and
   forming an etched pattern by etching the etching target layer using the hardmask pattern as an etching mask;
   wherein an average size of the plurality of openings is less than an average length of the carbon allotrope.

2. The method of claim 1, wherein, in the preparing the hardmask composition, the carbon allotrope is dispersed by the solvent, and the SOH material is dissolved by the solvent.

3. The method of claim 2, wherein, in the preparing the hardmask composition, the hardmask composition further comprises an additive including a cross-linker, a radical stabilizer, a surfactant, a pH regulator, or a combination thereof.

4. The method of claim 1, wherein, in the preparing the hardmask composition, the carbon allotrope includes a fullerene, a carbon nanotube, graphene, carbon black, or a combination thereof.

5. The method of claim 1, wherein, in the preparing the hardmask composition, the carbon allotrope has an average diameter of 1 nm to 50 nm, an average length of 100 nm to 300 nm, and a metal impurity content of 100 ppm or less.

6. The method of claim 1, wherein, in the preparing the hardmask composition, the carbon allotrope includes a single wall structure, a double wall structure, a multiple wall structure, or a combination thereof.

7. The method of claim 1, wherein, in the preparing the hardmask composition, the solvent includes at least one of propylene glycol monomethyl ether acetate (PGMEA), propylene glycol monomethyl ether (PGME), cyclohexanone, and ethyl lactate.

8. The method of claim 1, wherein, the applying the hardmask composition applies the hardmask composition by a spin-on coating method.

9. The method of claim 1, wherein, in the preparing the hardmask composition, a weight ratio of the carbon allotrope to the SOH material is 1:9 to 2:8.

10. The method of claim 1, wherein, in the forming the etched pattern, the etched pattern includes a hole pattern.

11. A method of forming patterns for a semiconductor device, the method comprising:
    forming an etching target layer including an uneven pattern on a substrate, the uneven pattern including a plurality of openings;
    applying a hardmask composition including a carbon allotrope, a spin-on hardmask (SOH) material, and a solvent on the etching target layer;
    forming a hardmask by heat-treating the applied hardmask composition;
    sequentially forming an anti-reflection coating layer and a photoresist pattern on the hardmask; and
    forming a hardmask pattern by etching the anti-reflection coating layer and the hardmask using the photoresist pattern as an etching mask;
    wherein an average diameter of the plurality of opening is less than an average length of the carbon allotrope.

12. The method of claim 11, wherein, in the applying the hardmask composition, the carbon allotrope is dispersed by the solvent, and the SOH material is dissolved by the solvent.

13. The method of claim 11, wherein, in the forming the hardmask, the hardmask covers the uneven pattern, and an upper surface of the hardmask is substantially flat.

14. The method of claim 11, wherein, in the forming the etching target layer, the plurality of openings are exposed at an upper surface of the etching target layer.

15. The method of claim 11, further comprising:
    forming an etched pattern having a shape different from that of the uneven pattern by etching the etching target layer using the hardmask pattern as an etching mask after the forming the hardmask pattern.

16. A method of manufacturing an integrated circuit device comprising:
    forming a device isolation layer in a substrate to define a plurality of active regions;
    forming an etching target layer on the substrate, the etching target layer including a plurality of openings;
    preparing a hardmask composition including a carbon allotrope, a spin-on hardmask (SOH) material, and a solvent;
    applying the hardmask composition to the etching target layer;
    forming a hardmask by heat-treating the applied hardmask composition;
    forming a photoresist pattern on the hardmask;
    forming a hardmask pattern by etching the hardmask using the photoresist pattern as an etching mask; and
    forming an etched pattern by etching the etching target layer using the hardmask pattern as an etching mask;
    wherein an average size of the plurality of openings is less than an average length of the carbon allotrope.

17. The method of claim 16, wherein, in the preparing the hardmask composition, the carbon allotrope is dispersed by the solvent, and the SOH material is dissolved by the solvent.

18. The method of claim 17, wherein, in the preparing the hardmask composition, the hardmask composition further comprises an additive including a cross-linker, a radical stabilizer, a surfactant, a pH regulator, or a combination thereof.

19. The method of claim 16, wherein, in the preparing the hardmask composition, the carbon allotrope includes a fullerene, a carbon nanotube, graphene, carbon black, or a combination thereof.

20. The method of claim 16, wherein, in the preparing the hardmask composition, the carbon allotrope has an average diameter of 1 nm to 50 nm, an average length of 100 nm to 300 nm, and a metal impurity content of 100 ppm or less.

\* \* \* \* \*